United States Patent
An et al.

(10) Patent No.: US 9,424,901 B1
(45) Date of Patent: Aug. 23, 2016

(54) SEMICONDUCTOR MEMORY DEVICE OUTPUTTING STATUS SIGNAL AND OPERATING METHOD THEREOF

(71) Applicant: SK hynix Inc., Icheon-si Gyeonggi-do (KR)

(72) Inventors: Chi Wook An, Icheon-si (KR); Ju Yeab Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/053,165

(22) Filed: Feb. 25, 2016

(30) Foreign Application Priority Data

Sep. 30, 2015  (KR) .......................... 10-2015-0137959

(51) Int. Cl.
*G11C 7/00* (2006.01)
*G11C 7/22* (2006.01)

(52) U.S. Cl.
CPC ...................................... *G11C 7/227* (2013.01)

(58) Field of Classification Search
CPC ........................................................ G11C 7/227
USPC ................................................. 365/191, 193
See application file for complete search history.

(56) References Cited

U.S. PATENT DOCUMENTS

| | | | |
|---|---|---|---|
| 8,363,466 B2 | 1/2013 | Shinozaki et al. | |
| 2005/0180213 A1* | 8/2005 | Abe | G11C 11/5621 365/185.17 |
| 2006/0221718 A1* | 10/2006 | Ono | G11C 16/22 365/189.04 |
| 2010/0002493 A1* | 1/2010 | Miyakawa | G11C 7/12 365/149 |
| 2010/0271862 A1* | 10/2010 | Yoon | G11C 8/10 365/148 |
| 2012/0014164 A1* | 1/2012 | Kamoshida | G11C 13/0004 365/148 |
| 2016/0020389 A1* | 1/2016 | Ratnam | G11C 13/004 257/2 |

FOREIGN PATENT DOCUMENTS

KR   1020140093855 A   7/2014

\* cited by examiner

*Primary Examiner* — Viet Q Nguyen
(74) *Attorney, Agent, or Firm* — William Park & Associates Ltd.

(57) ABSTRACT

An operating method of a semiconductor memory device may include receiving a command, outputting a status signal as a busy status while accessing a selected area of the memory cell array in response to the command, changing the status signal from the busy status to a ready status and outputting the status signal after the access is completed, and applying a dummy pulse to an unselected area of the memory cell array in response to the status signal being output as the ready status.

20 Claims, 11 Drawing Sheets

FIG. 10

| Line | voltage |
|---|---|
| DSL | Vdm |
| SSL | Vdm |
| WL | Vdm |
| PL | Vdm |
| BL | Vss |
| CSL | Vss |

FIG. 11

| Line | voltage |
|---|---|
| DSL | Vdm |
| SSL | Vdm |
| WL | Vss |
| PL | Vss |
| BL | Vss |
| CSL | Vss |

FIG. 12

| Line | voltage |
|---|---|
| DSL | Vdm |
| SSL | Vdm |
| WL | floating |
| PL | floating |
| BL | floating |
| CSL | floating |

US 9,424,901 B1

SEMICONDUCTOR MEMORY DEVICE OUTPUTTING STATUS SIGNAL AND OPERATING METHOD THEREOF

CROSS-REFERENCE TO RELATED APPLICATION

The present application claims priority under 35 U.S.C. §119(a) to Korean patent application number filed on 10-2015-0137959 filed on Sep. 30, 2015 in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device for outputting a status signal and an operating method thereof.

2. Related Art

Semiconductor memory devices are data storage devices realized using semiconductor materials. The semiconductor memory devices are largely divided into a volatile memory device and a nonvolatile memory device.

The volatile memory device is a memory device that loses data stored therein when power is turned off. The volatile memory device includes static RAM (SRAM), dynamic RAM (DRAM), synchronous DRAM (SDRAM), or the like. The nonvolatile memory device is a memory device that retains data stored therein even when power is turned off. The nonvolatile memory device includes read only memory (ROM), programmable ROM (PROM), Electrically Programmable ROM (EPROM), Electrically Erasable and Programmable ROM (EEPROM), Flash memory, Phase-change RAM (PRAM), Magnetic RAM (MRAM), Resistive RAM (RRAM), Ferroelectric RAM (FRAM), or the like. The Flash memories are largely divided into a NOR type and a NAND type.

BRIEF DESCRIPTION OF THE DRAWINGS

FIG. 10 is a table illustrating an example of a method for applying a dummy pulse.

FIG. 11 is a table illustrating an example of a method for applying a dummy pulse.

FIG. 12 is a table illustrating an example of a method for applying a dummy pulse;

DETAILED DESCRIPTION

Figure 1:
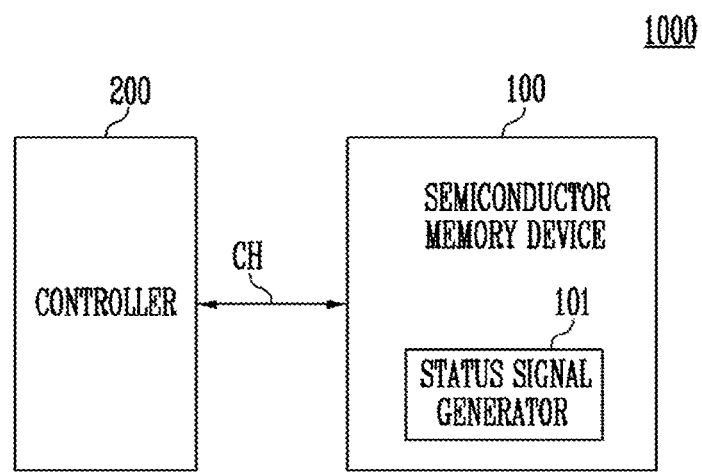
FIG. 1 is a diagram illustrating a memory system including a semiconductor memory device and a controller.

In an embodiment of the present disclosure, an operating method of a semiconductor memory device, which comprises a memory cell array, may include receiving a command, outputting a status signal as a busy status while accessing a selected area of the memory cell array in response to the command, changing the status signal from the busy status to a ready status and outputting the status signal after the access is completed, and applying a dummy pulse to an unselected area among the memory cell array in response to the status signal being output as the ready status.

In an embodiment, applying the dummy pulse may include applying the dummy pulse to the selected area in response to the status signal being output as the ready status.

In an embodiment, the operating method may further include decreasing a voltage level of the dummy pulse if a second command is received when the dummy pulse is being applied.

In an embodiment, a time when the dummy pulse decreases may overlap a time when the second command and an address corresponding to the second command are received.

In an embodiment, the operating method may further include performing an operation corresponding to the second command after the dummy pulse has changed to a low level, wherein the status signal is output as a busy status while the operation corresponding to the second command is performed.

In an embodiment, the memory cell array may include a plurality of memory blocks corresponding to a unit of an erase operation. Each of the plurality of memory blocks may comprise drain selection transistors, source selection transistors, and memory cells connected between the drain selection transistors and the source selection transistors. The selected area may be a first memory block among the plurality of memory blocks. The unselected area may be remaining second memory blocks among the plurality of memory blocks.

In an embodiment, applying the dummy pulse may include applying the dummy pulse to the drain selection transistors, the memory cells, and the source selection transistors of the second memory blocks in response to the status signal being output as the ready status.

In an embodiment, applying the dummy pulse may include applying the dummy pulse to the drain selection transistors and the source selection transistors of the second memory blocks in response to the status signal being output as the ready status.

In an embodiment, the memory cells may be divided into first memory cells and second memory cells. Each of the plurality of memory blocks may further include pipe selection transistors coupled between the first memory cells and the second memory cells. Applying the dummy pulse may include applying the dummy pulse to the drain selection transistors, the memory cells, pipe selection transistors, and the source selection transistors of the second memory blocks in response to the status signal being output as the ready status.

In an embodiment, applying the dummy pulse may include applying the dummy pulse to the drain selection transistors, the memory cells, and the source selection transistors of the plurality of memory blocks in response to the status signal being output as the ready status.

In an embodiment, applying the dummy pulse may include applying the dummy pulse to the drain selection transistors and the source selection transistors of the plurality of memory blocks in response to the status signal being output as the ready status.

In an embodiment, the memory cells may be divided into first memory cells and second memory cells. Each of the plurality of memory blocks may further include pipe selection transistors coupled between the first memory cells and the second memory cells. Applying the dummy pulse may include applying the dummy pulse to the drain selection transistors, the memory cells, the pipe selection transistors, and the source selection transistors of the plurality of memory blocks in response to the status signal being output as the ready status.

In an embodiment, the status signal may be a ready busy signal.

In an embodiment, the status signal may be a status read response signal.

In an embodiment, the access may correspond to a program operation.

In an embodiment, the access may correspond to an erase operation.

In an embodiment of the present disclosure, a semiconductor memory device may include a memory cell array and a peripheral circuit. The memory cell array may include a plurality of memory blocks. The peripheral circuit may perform a plurality of steps. The steps may include accessing memory blocks selected from among plurality of memory blocks of the memory cell array while outputting a status signal as a busy status in response to a command, outputting the status signal as the ready status after the access has been completed, and applying a dummy pulse to unselected memory blocks in response to the status signal being output as the ready status.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments of the present invention will be described in detail with reference to the accompanying drawings. The following descriptions will be made focusing on configurations necessary for understanding embodiments of the invention. Therefore, descriptions of other configurations that might obscure the gist of the disclosure will be omitted. Accordingly, the present disclosure is not limited to the following embodiments but embodied in other types. Rather, these embodiments are provided so that this disclosure will be thorough, and convey the technical idea of the present disclosure to those skilled in the art.

In addition, if certain parts are described as being "connected" to other parts, they are not only "directly connected" to the other parts, but also "indirectly connected" to the other parts with any other device intervened therebetween. In addition, when an element is referred to as "comprising" or "including" a component, it does not preclude another component but may further include the other component unless the context clearly indicates otherwise.

Figure 2:
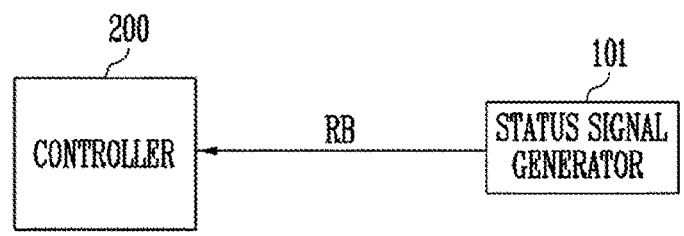
FIG. 2 is a diagram illustrating an example of a status signal generator providing a status signal to a controller.
Figure 3:
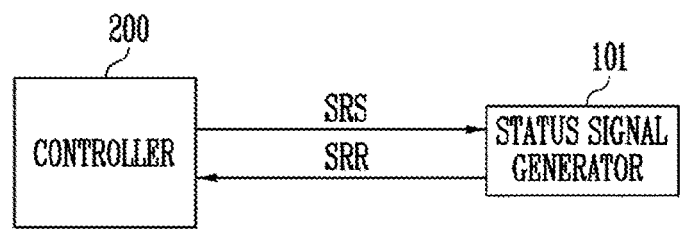
FIG. 3 is a diagram illustrating an example of a status signal generator providing a status signal to a controller.

FIG. 1 is a diagram illustrating a memory system 1000 including a semiconductor memory device 100 and a controller 200. FIG. 2 is a diagram illustrating an example of a status signal generator 101 providing a status signal to the controller 200. FIG. 3 is a diagram illustrating an example of a status signal generator 101 providing a status signal to the controller 200.

Referring FIG. 1, the memory system 1000 may include the semiconductor memory device 100 and a controller 200.

The semiconductor memory device 100 may operate in response to control signals (not illustrated) provided by the controller 200. The semiconductor memory device 100 may include a memory cell array including a plurality of memory blocks. In an embodiment, the semiconductor memory device 100 may include a flash memory device.

The semiconductor memory device 100 may receive a command and an address through a channel CH from the controller 200, and may access an area of the memory cell array (e.g., memory cells selected from among a plurality of memory cells of the memory cell array) by an address. In other words, the semiconductor memory device 100 may perform an internal operation corresponding to a command for the area selected by the address.

For example, the semiconductor memory device 100 may perform program, read, and erase operations. During the program operation, the semiconductor memory device 100 may program data in an area selected by an address. During the read operation, the semiconductor memory device 100 may read data from an area selected by an address. During the erase operation, the semiconductor memory device 100 may erase data stored in an area selected by an address.

The semiconductor memory device 100 may include the status signal generator 101. The status signal generator 101 may output a status signal indicating whether the semiconductor memory device 100 is in a ready status or a busy status.

The ready status may mean that the semiconductor memory device 100 has completed an internal operation and is in an idle status. For example, the ready status may mean that the semiconductor memory device 100 has completed a program operation, a read operation, or an erase operation corresponding to a command.

The busy status may mean that the semiconductor memory device 100 is performing an internal operation. For example, the busy status may mean that the semiconductor memory device 100 is performing a program operation, a read operation, or an erase operation corresponding to a command.

In an embodiment, as illustrated in FIG. 2, the status signal generator 101 may output a ready busy signal RB as a status signal. The status signal generator 101 may be coupled to the controller 200 through a ready busy line (not illustrated) distinguished from a channel CH, and may output the ready busy signal RB through the ready busy line. For example, the ready busy signal RB disabled (e.g., the ready busy signal RB that is at a logic high level) may mean that the semiconductor memory device 100 is in a ready status, and the ready busy signal RB enabled (e.g., the ready busy signal RB that is at a logic low level) may mean that the semiconductor 100 is in the busy status. As another example, a terminal having high impedance, through which the ready busy signal RB is output, may mean that the semiconductor memory device 100 is in the ready status.

In an embodiment, as illustrated in FIG. 3, the status signal generator 101 may output a status read response signal SRR as a status signal. The controller 200 may transmit a status read signal SRS to the semiconductor memory device 100 through the channel CH (see FIG. 1), and, in response to the status read signal SRS, the status signal generator 101 may transmit the status read response signal to the controller 200 through the channel CH. For example, the status read response signal SRR having a first status value may mean that the semiconductor memory device 100 is in a ready status, and the status read response signal SRR having a second status value may mean that the semiconductor device 100 is in a busy status.

When the status signal represents the ready status, the controller 200 may transmit a next command to the semiconductor memory device 100.

Referring back to FIG. 1, the controller 200 may control the semiconductor memory device 100 through the channel CH. The controller 200 may issue a command to the semiconductor memory device 100 in response to a request from a host (not illustrated). When the status signal represents the ready status, the controller 200 may issue a command for a specific operation to the semiconductor memory device 100. When the status signal represents the busy status, the controller 200 may wait until the status signal changes to the ready status, and then may issue a command for a specific operation to the semiconductor memory device 100.

In an embodiment, the controller 200 may control the semiconductor memory device 100 to perform the program operation, read operation, or erase operation. During the program operation, the controller 200 may provide a program command, an address, and data to the semiconductor memory device 100 through the channel CH. During the read operation, the controller 200 may provide a read command and an address to the semiconductor memory device 100 through the channel CH. During the erase operation, the controller 200 may provide an erase command and an address to the semiconductor memory device 100 through the channel CH.

In an embodiment, the controller 200 may include elements such as a random access memory (RAM), a processing unit, a host interface, and a memory interface (not illustrated). The RAM may be used as at least one of various types of memories including an operation memory of the processing unit, a cache memory provided between the semiconductor memory device 100 and the host, and a buffer memory provided between the semiconductor memory device 100 and the host. The processing unit may control the overall operation of the controller 200.

The host interface may include a protocol for performing a data exchange operation between the host and the controller 200. In an embodiment, the controller 200 may communicate with the host through at least one of various interface protocols including Universal Serial Bus (USB) protocol, multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, and Integrated Drive Electronics (IDE) protocol, private protocol, and the like.

The memory interface may interface with the semiconductor memory device 100. For example, the memory interface includes a NAND interface or a NOR interface.

Figure 4:
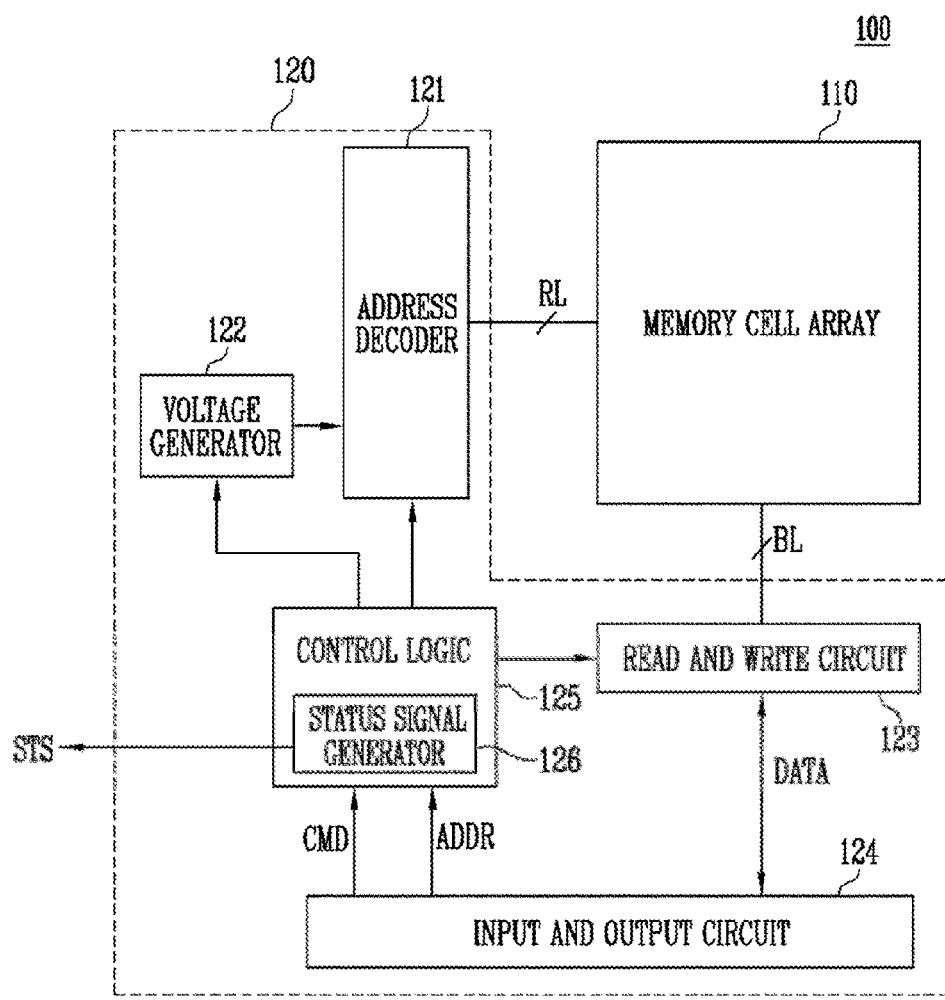
FIG. 4 is a diagram illustrating a semiconductor memory device.

FIG. 4 is a diagram illustrating the semiconductor memory device 100.

Referring FIG. 4, the semiconductor memory device 100 includes a memory cell array 110 and a peripheral circuit 120.

The memory cell array 110 may be coupled to an address decoder 121 through row lines RL. The memory cell array 110 may be coupled to a read and write circuit 123 through bit lines BL.

The memory cell array 110 may include a plurality of memory blocks. Each of the plurality of memory blocks may include a plurality of pages. Each of the plurality of pages may include a plurality of memory cells. In an embodiment, the plurality of memory cells may include nonvolatile memory cells. A detailed description will be provided with reference to FIGS. 5 and 6.

The peripheral circuit 120 may include an address decoder 121, a voltage generator 122, a read and output circuit 123, an input and output circuit 124, and a control logic 125.

The address decoder 121 may be coupled to the memory cell array 110 through the row lines RL. The address decoder 121 may control the row lines RL in response to control signals provided by the control logic 125. The address decoder 121 may receive an address ADDR from the control logic 125.

In an embodiment, program and read operations of the semiconductor memory device 100 may be performed on a page basis. When the address decoder 121 receives the address ADDR during the program and read operations, the address ADDR may include a block address and a row address. The address decoder 121 may decode the address ADDR to detect the block address and the row address. The address decoder 121 may select at least one memory block according to the decoded block address, and may select a certain page of the memory block according to the row address.

In an embodiment, the erase operation of the semiconductor memory device 100 may be performed on a block basis (i.e., memory block basis). When the address decoder 121 receives the address ADDR during the erase operation, the address ADDR may include a block address. The address decoder 121 may decode the address ADDR to select at least one memory block according to the decoded block address.

In an embodiment, the address decoder 121 may include a block decoder, a row decoder, and an address buffer.

The voltage generator 122 may operate in response to control signals of the control logic 125. The voltage generator 122 may generate an internal power source voltage by using an external power source voltage supplied to the semiconductor memory device 100. For example, the voltage generator 122 may regulate the external power source voltage to generate the internal power source voltage. The internal power source voltage may be provided to the address decoder 121, the read and write circuit 123, the input and output circuit 124, and the control logic 125 to be used as an operation voltage of the semiconductor memory device 100.

The voltage generator 122 may generate a plurality of voltages by using at least one of the external power source voltage and the internal power source voltage. In an embodiment, the voltage generator 122 may include a plurality of pumping capacitors for receiving the internal power source voltage and stepping up a voltage level thereof, and may generate the plurality of voltages by selectively activating the plurality of pumping capacitors in response to the control signals of the control logic 125. For example, the voltage generator 122 may generate various voltages to be applied to the row lines RL, and may provide the generated voltages to the address decoder 121.

The read and write circuit 123 may be coupled to the memory cell array 110 through bit lines BL. The read and write circuit 123 may operate in response to the control signals of the control logic 125.

During the program operation, the read and write circuit 123 may deliver data DATA from the input and output circuit 124 to the bit lines BL. Memory cells of a selected page may be programmed according to the delivered data DATA. During the read operation, the read and write circuit 123 may read data DATA from the memory cells of the selected page through the bit lines BL, and may output the read data DATA to the input and output circuit 124. During the erase operation, the read and write circuit 123 may allow the bit lines BL to float.

In an embodiment, the read and write circuit 123 may include page buffers (or page registers), a column selection circuit, or the like.

The control logic 125 may be coupled to the address decoder 121, the voltage generator 122, the read and write circuit 123, and the voltage generating unit 124. The control logic 125 may receive a command CMD and an address ADDR from the input and output circuit 124. The control logic 125 may control the semiconductor memory device 100 to perform an internal operation corresponding to the command CMD. The control logic 125 may transmit the address ADDR to the address decoder 121.

The control logic 125 may include a status signal generator 126. For example, the status signal generator 126 may correspond to the status signal generator 101 described with reference to FIG. 1. The control logic 125 may internally transmit information on an operation status of the semiconductor memory device 100 to the status signal generator 126. The status signal generator 126 may output a status signal STS according to the internally delivered information.

Figure 5:
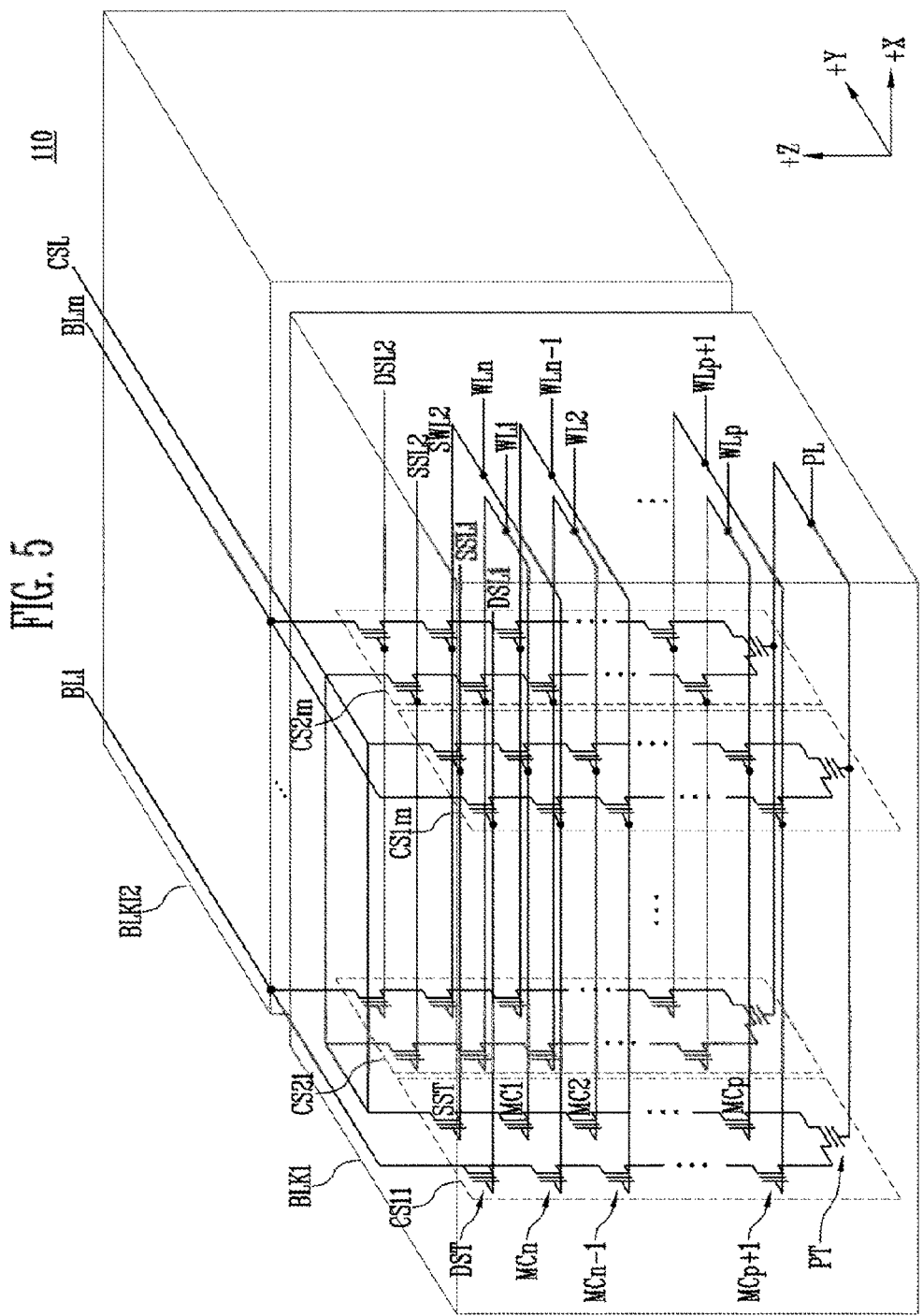
FIG. 5 is a diagram illustrating an example of the memory cell array illustrated in FIG. 4.

FIG. 5 is a diagram illustrating an example of the memory cell array 110 illustrated in FIG. 4.

Referring to FIG. 5, the memory cell array 110 may include a plurality of memory blocks BLK1 to BLKz. In FIG. 5, for convenience purposes, only an internal configuration of the first memory block BLK1 is illustrated, and internal configurations of the remaining memory block BLK2 to BLKz are omitted. It will be understood that the second to $z^{th}$ memory blocks BLK2 to BLKz may have the same or substantially the same configuration as the first memory block BLK1.

Referring to FIG. 5, the first memory block BLK1 may include a plurality of cell strings CS11 to CS1$m$, and CS21 to CS2$m$. In an embodiment, each of the plurality of cell strings CS11 to CS1$m$, and CS21 to CS2$m$ may be formed in a "U" type. In the first memory block BLK1, m cell strings are arrayed in a row direction (i.e., +X direction). FIG. 5 illustrates that two cell strings are arrayed in a column direction (i.e., +Y direction). However, it will be understood that this is for convenience purposes only, and three or more cell strings may be arrayed in a row direction.

Each of the plurality of cell strings CS11 to CS1$m$, and CS21 to CS2$m$ may include at least one source selection transistor SST, first to $n^{th}$ memory cells MC1 to MCn, a pipe transistor PT, and at least one drain selection transistor DST.

Each of the selection transistors SST and DST and the memory cells MC1 to MCn has the same or a similar structure. In an embodiment, each of the selection transistors SST and DST and the memory cells MC1 to MCn may include a channel layer, a tunneling insulating layer, a charge storage layer, and a blocking insulation layer. In an embodiment, a pillar for providing the channel layer may be provided to each cell string. In an embodiment, the pillar, which provides at least one of the channel layer, tunneling insulating layer, charge storage layer, and the blocking insulation layer, may be provided to each cell string.

The source selection transistor SST of each cell string may be coupled to a common source line CSL and the memory cells MC1 to MCp.

In an embodiment, source selection transistors of the cell strings arrayed in the same row are connected to a source selection line expanded in a row direction, and source selection transistors of the cell strings arrayed in different rows may be coupled to different source selection lines. In FIG. 5, the source selection transistors of the cell strings CS11 to CS1$m$ in a first row may be coupled to a first source selection line SSL1. The source selection transistors of the cell strings CS21 to CS2$m$ in a second row may be coupled to a second source selection line SSL2.

In an embodiment, the source selection transistors of the cell strings CS11 to CS1$m$, and CS21 to CS2$m$ may be coupled to a source selection line.

The first to $n^{th}$ memory cells MC1 to MCn of each cell string may be coupled between the source selection transistor SST and the drain selection transistor DST.

The first to $n^{th}$ memory cells MC1 to MCn may be divided into first to $p^{th}$ memory cells MC1 to MCp and $(p+1)^{th}$ to $n^{th}$ memory cells MCp+1 to MCn. The first to $p^{th}$ memory cells MC1 to MCp may be sequentially arrayed in a +Z direction and in a reverse direction, and may be coupled in series between the source selection transistor SST and the pipe transistor PT. The $(p+1)^{th}$ to $n^{th}$ memory cells MCp+1 to MCn may be sequentially arrayed in the +Z direction, and may be coupled in series between the pipe transistor PT and the drain selection transistor DST. The first to $p^{th}$ memory cells MC1 to MCp and the $(p+1)^{th}$ to $n^{th}$ memory cells MCp+1 to MCn may be coupled through the pipe transistor PT. Gates of the first to $n^{th}$ memory cells MC1 to MCn of each cell string may be coupled to first to $n^{th}$ word lines WL1 to WLn, respectively.

In an embodiment, at least one of the first to $n^{th}$ memory cells MC1 to MCn may be used as a dummy memory cell. When the dummy memory cell is provided, a voltage or current of a corresponding cell string may be stably controlled. Accordingly, reliability of data stored in the memory block BLK1 may be improved.

A gate of the pipe transistor PT of each cell string may be coupled to a pipe line PL.

The drain selection transistor DST of each cell string may be coupled between a corresponding bit line and the memory cells MCp+1 to MCn. The cell strings arrayed in the row direction may be coupled to drain selection lines extending in the row direction. The drain selection transistors of the cell string CS11 to CS1$m$ in the first row may be coupled to the first drain selection line DSL1. The drain selection transistors of the cell string CS21 to CS2$m$ in the second row may be coupled to the second drain selection line DSL2.

The cell strings arrayed in the row direction may be coupled to bit lines extending in the row direction. In FIG. 5, the cell strings CS11 and CS21 of a first column may be coupled to a first bit line BL1. The cell strings CS1$m$ and CS2$m$ of an $m^{th}$ column may be coupled to an $m^{th}$ bit line BL$m$.

Memory cells belonging to different cell strings may be coupled to the same word line, and the memory cells coupled to the same word line may constitute a page. For example, memory cells coupled to a first word line among the cell strings CS11 to CS1$m$ of the first row constitute one page. Memory cells connected to the first word line among the cell strings CS21 to CS2$m$ of the second row constitute another page. The cell strings arrayed in a direction of one row may be selected by selecting any one of the drain selection lines DSL1 and DSL2. One page among the selected cell strings may be selected by selecting any one of the word lines WL1 to WLn.

Figure 6:
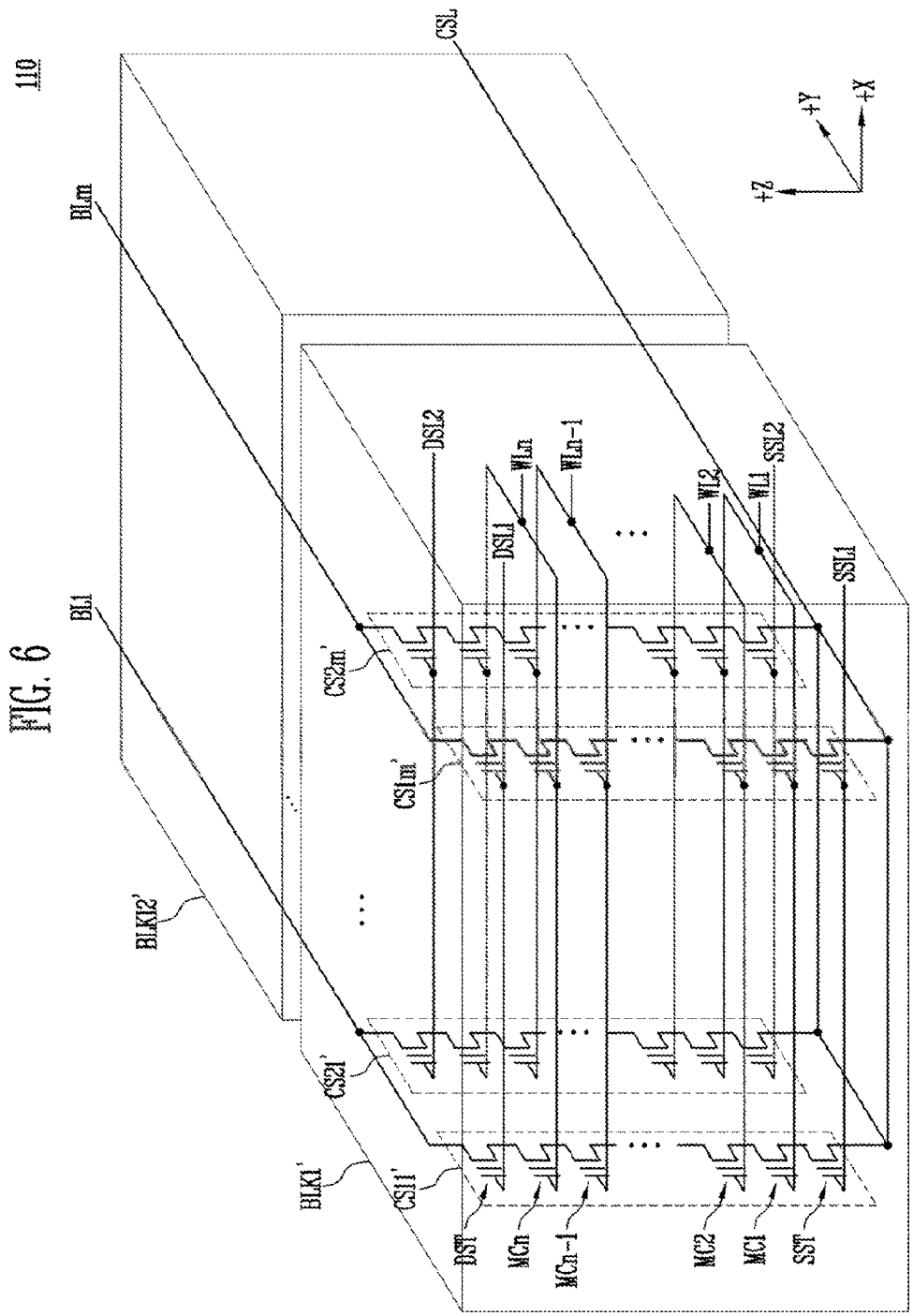
FIG. 6 is a diagram illustrating an example of the memory cell array illustrated in FIG. 4.

FIG. 6 is a diagram illustrating an example of the memory cell array 110 illustrated in FIG. 4.

Referring to FIG. 6, the memory cell array 110 may include a plurality of memory blocks BLK1' to BLKz'. In FIG. 6, for convenience purposes, only an internal configuration of the first memory block BLK1' is illustrated, and internal configurations of the remaining memory blocks BLK2' to BLKz' are omitted. It will be understood that the second to $z^{th}$ memory blocks BLK2' to BLKz' may have the same or substantially the same configuration as the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend along a +Z direction. In the first memory block BLK1, m cell strings may be arrayed in a +X direction. In FIG. 6, two cell strings are illustrated as arrayed in a +Y direction. However, it will be understood that this is for convenience purposes only, and three or more cell strings may be arrayed in a column direction.

Each of the plurality of cell strings CS11' to CS1m', and CS21' to CS2m' may include at least one source selection transistor SST, first to nth memory cells MC1 to MCn, and at least one drain selection transistor DST.

The source selection transistor SST of each cell string may be coupled between a common source line CSL and the memory cells MC1 to MCn. The source selection transistors of cell strings arrayed in the same row may be coupled to the same source selection line. The source selection transistors of the cell strings CS11' to CS1m' arrayed in the first row may be coupled to the first source selection line SSL1. The source selection transistors of the cell strings CS21' to CS2m' arrayed in the second row may be coupled to the second source selection line SSL2. In an embodiment, the source selection transistors of the cell strings CS11' to CS1m' and CS21' to CS2m' may be coupled in common to a source selection line.

The first to $n^{th}$ memory cells MC1 to MCn of each cell string may be coupled in series between the source selection transistor SST and the drain selection transistor DST. Gates of the first to $n^{th}$ memory cells MC1 to MCn may be coupled to first to $n^{th}$ word lines WL1 to WLn, respectively.

In an embodiment, at least one of the first to $n^{th}$ memory cells MC1 to MCn may be used as a dummy memory cell. When the dummy memory cell is provided, a voltage or current of a corresponding cell string may be stably controlled. Accordingly, reliability of data stored in the memory block BLK1' may be improved.

The drain selection transistor DST of each cell string may be coupled between a corresponding bit line and the memory cells MC1 to MCn. The drain selection transistors arrayed in the row direction may be coupled to drain selection lines extending in the row direction. The drain selection transistors of the cell string CS11' to C11m' in the first row may be coupled to the first drain selection line DSL1. The drain selection transistors of the cell string CS21' to CS2m' in the second row may be coupled to the second drain selection line DSL2.

Consequently, except for the pipe transistor PT excluded from each cell string, the memory block BLK1' of FIG. 6 may have the same or substantially the same configuration as the memory block BLK1 of FIG. 5.

Hereinafter, for convenience purposes, operations of the memory block BLK1 of FIG. 5 will be described by way of example.

Figure 7:
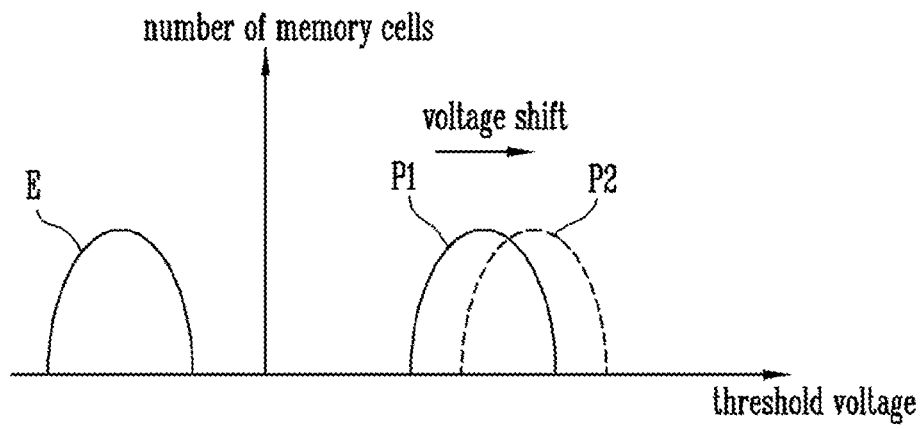
FIG. 7 is a diagram illustrating an example of a threshold voltage distribution of memory cells.

FIG. 7 is a diagram illustrating an example of a threshold voltage distribution of memory cells. In FIG. 7, a horizontal axis denotes a threshold voltage of a memory cell and a vertical axis denotes the number of memory cells.

Referring to FIG. 7, the memory cells may have threshold voltages corresponding to an erase status E and a program status P1 by a program operation. It is assumed that a page of the first memory block BLK1 among the plurality of memory blocks BLK1 to BLKz (see FIG. 5) is programmed. The memory cells in a corresponding page will have the erase status E and the program status P1.

Thereafter, the second memory block BLK2 among the plurality of memory blocks BLK1 to BLKz may be accessed. For example, a program operation or an erase operation may be performed on the second memory block BLK2.

During the program or erase operation, predetermined voltages may be repetitively applied to the second memory block BLK2. The voltages applied to the second memory block BLK2, however, may cause stress to other memory blocks (e.g., BLK1). For example, in a situation where the plurality of memory blocks BLK1 to BLKz are coupled in common to the bit lines BL1 to BLm (see FIG. 5), and the plurality of memory blocks BLK1 to BLKz are coupled in common to a common source line CSL, a voltage applied to the bit lines BL1 to BLm and the common source line CSL for an access to the second memory block BLK2 may influence other memory blocks. For example, a voltage applied to the common source line CSL for an erase operation on the second memory block BLK2 may be unintentionally applied to other memory blocks. For example, a voltage applied to the bit lines BL1 to BLm for a program operation on the second memory block BLK2 may be unintentionally applied to other memory blocks. Accordingly, unintended charges may be injected to the channel layers of the cell strings CS11 to CS1m and CS21 to CS2m of other memory blocks.

In addition, due to various causes, the program and erase operations for the second memory block BLK2 may cause charges to be injected to the channel layers of cell strings CS11 to CS1m and CS21 to CS2m of other memory blocks (e.g., BLK1).

When a read operation is performed subsequently on a corresponding page of the first memory block BLK1, the corresponding page may be read by electrically connecting corresponding cell strings to the bit lines BL1 to BLm, applying proper voltages to the word lines WL1 to WLn, and by sensing voltages or currents of the bit lines BL1 to BLm. If the unintended charges are injected to the channel layers of the cell strings CS11 to CS1m and CS21 to CS2m of the first memory block BLK1, electric potentials of the channel layers of the cell strings CS11 to CS1m and CS21 to CS2m may become relatively high. Accordingly, although an identical voltage is applied to the word lines WL1 to WLn, voltages or currents detected through the bit lines BL1 to BLm may be reduced. The reduction of the voltages or currents of the bit lines BL1 to BLm may cause the memory cells in the program status P1 to be read as a program status P2 which is in a higher voltage range than the program status P1. This phenomenon may a reduction in reliability of data stored in the first memory block BLK1.

According to an embodiment of the present disclosure, after the program or erase operation is performed on the second memory block BLK2, dummy pulses may be applied to other memory blocks (e.g., BLK1). For example, the dummy pulses may be applied to the selection lines DSL and SSL, and the word lines WL1 to WLn of the first memory block BLK1. Accordingly, the charges injected to the channel layers of the cell strings CS11 to CS1m and CS21 to CS2m may be discharged to the bit line BL and the common source line CSL. Accordingly, reliability of data stored in the memory block BLK1 may be improved.

Furthermore, according to the application of the dummy pulses after the program or erase operation is performed on the second memory block BLK2, an operation time for the program or erase time may be increased.

Figure 8:
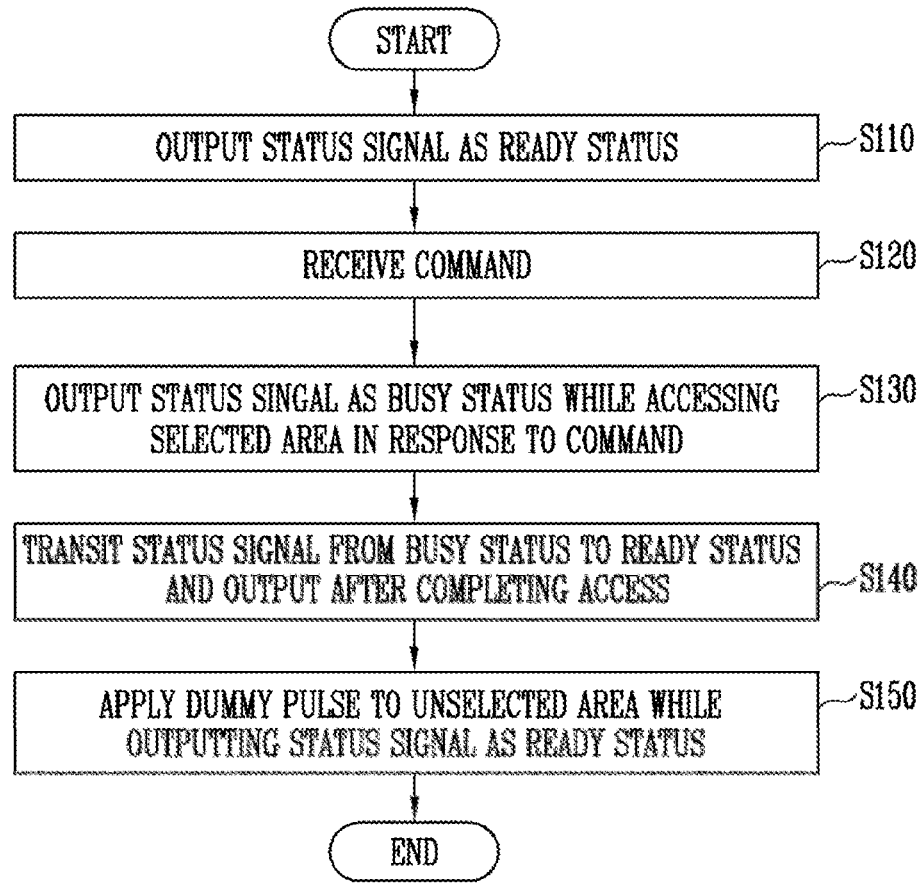
FIG. 8 is a flow chart illustrating an example of an operating method of a semiconductor memory device according to an embodiment of the present disclosure.

FIG. 8 is a flow chart illustrating an example of an operating method of a semiconductor memory device 100 according to an embodiment of the present disclosure. The operating method may include a plurality of steps S110, S120, . . . , and S150.

Referring to FIGS. 1, 4, and 8, in the step S110, the status signal STS may be output as a ready status. In the step S120, a command is received. The controller 200 may issue a command to the semiconductor memory device 100, when the status signal STS represents the ready status.

In the step S130, if a selected area is accessed in response to the command, the status signal STS is output as a busy status. In an embodiment, the access may correspond to the program operation. Alternatively, the access may correspond to the erase operation.

In response to a program command, the peripheral circuit 120 may perform a program operation on a selected page of a selected memory block. Until the threshold voltages of the memory cells in the selected page reach desired threshold voltages, high program voltages, which may have incremental step pulses, may be repetitively applied to the word lines coupled to the selected page. In addition, for example, each time the high program voltage is applied to the word lines coupled to the selected page, a verification operation may be performed on the selected page to determine whether the memory cells of the selected page have reached the desired threshold voltages. If the threshold voltages of the memory cells of the selected page have not reached the desired threshold voltages, the program voltage is applied again. If the threshold voltages of the memory cells of the selected page have reached the desired threshold voltages, the program operation is completed.

In response to an erase command, the peripheral circuit 120 may perform an erase operation on a selected memory block. Until the threshold voltages of the memory cells of the selected memory block reach desired threshold voltages, high erase voltages may be repetitively applied to the channel layers of the cell strings CS11 to CS1*m* and CS21 to CS2*m* of the selected memory block. In addition, a verification operation may be performed on the memory cells of the selected memory block to determine whether the threshold voltages of the memory cells of the selected memory block have reached the desired threshold voltages. If the threshold voltages of the memory cells of the selected memory block have not reached the desired threshold voltages, the erase voltage may be applied again. If the threshold voltages of the memory cells of the selected memory block have reached the desired threshold voltages, the erase operation may be completed.

In the step S140, after the access is completed, the status signal STS may change from the busy status to a ready status, and the status signal STS having the ready status may be output. An early change of the status signal STS from the busy status to the ready status may mean that a time for an internal operation (e.g., the program or erase operation) corresponding to a command is shortened. The earlier the status signal STS changes to the ready status, the earlier the controller 200 may issue a command for a next operation to the semiconductor memory device 100. In other words, the earlier the status signal STS changes to the ready status, the more an operation speed of the memory system 1000 may be improved.

In the step S150, the status signal STS may be output as the ready status, and a dummy pulse may be applied to an unselected area. For example, the dummy pulse may be applied to remaining unselected memory blocks except for the memory block selected in operation S130. The address decoder 121 may apply, to row lines of the unselected memory blocks, the dummy pulse provided from the voltage generator 122 in response to a control of the control logic 125.

The status signal STS output as the ready status may mean that the controller 200 may issue a command for a next operation to the semiconductor memory device 100. If a dummy pulse is applied while the status signal STS is output as the ready status, reliability of data stored in unselected memory blocks may be improved without an increase in an operation time of a program or erase operation, which could have been caused by the application of the dummy pulse.

Furthermore, the controller 200 may issue a command for the next operation to the semiconductor memory device 100 regardless of the operation for applying the dummy pulse. For example, the controller 200 may issue a command for the next operation to the semiconductor memory device 100 after completing the application of the dummy pulse. Alternatively, the controller 200 may issue a command for the next operation to the semiconductor memory device 100 during the application of the dummy pulse.

In an embodiment, when the controller 200 issues a command for the next operation during the application of the dummy pulse, the semiconductor memory device 100 may allow the voltage level of the dummy pulse to decrease (e.g., transition to a low level). Detailed description thereabout will be provided with reference to FIGS. 13 and 14.

Figure 9:
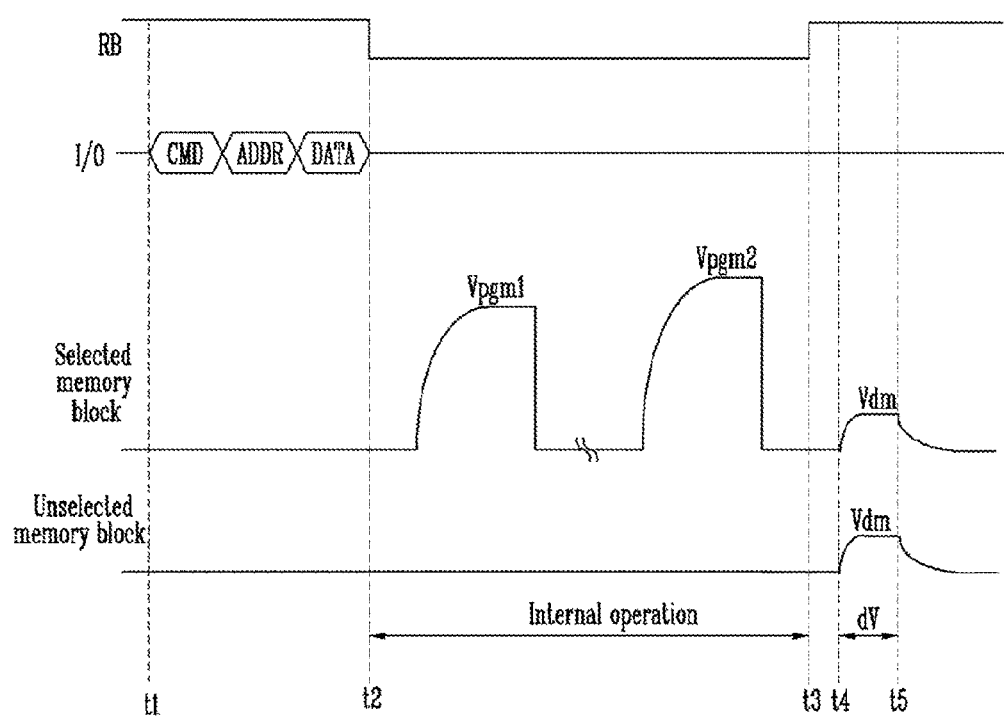
FIG. 9 is a timing diagram illustrating an example of an operating method of a semiconductor memory device according to an embodiment of the present disclosure.

FIG. 9 is a timing diagram illustrating an example of an operating method of a semiconductor memory device according to an embodiment of the present disclosure. In the description with reference to FIG. 9, it is assumed that the status signal STS is a ready busy signal RB (see FIG. 2). However, this is for convenience purposes only, and thus the status signal may be a status read response signal.

Referring to FIGS. 4 and 9, at a first point in time t1, the ready busy signal RB may be disabled (e.g., logic high level). In other words, the ready busy signal RB may be output as the ready status. When the ready busy signal RB represents the ready status, a command CMD and an address ADDR may be received through the input and output lines I/O. Hereinafter, for convenience purposes, the command CMD may be assumed as a program command. When the command CMD is the program command, data DATA may be additionally received. In an embodiment, although not illustrated in FIG. 9, a confirm command may be further received after the reception of the data DATA. The input/output lines I/O may be coupled to the input and output circuit 124. The input and output circuit 124 may provide the command CMD and the address ADDR to the control logic 125 and the data DATA to the read and write circuit 123.

At a second point in time t2, when the command CMD, address ADDR and the data DATA are received, the ready busy signal RB may be enabled (e.g., logic low level) to represent the busy status, and the semiconductor memory device 100 may perform an internal operation.

The peripheral circuit 120 may program data DATA in an area selected by the address ADDR. Program voltages Vpgm1 and Vpgm2 may be applied to selected word lines of a selected memory block. The program voltages Vpgm1 and Vpgm2 may be sequentially increased. Although not illustrated in FIG. 9, when each of the program voltages Vpgm1 and Vpgm2 is applied, a pass voltage lower than a corresponding program voltage may be applied to unselected word lines of the selected memory block. Furthermore, whether the threshold voltages of the memory cells of the selected page have reached threshold voltages corresponding to the data DATA may be repetitively verified. Although not illustrated in FIG. 9, a verification voltage may be applied to a selected word line of the selected memory block during the verification operation.

When the command CMD is an erase command, the peripheral circuit 120 may erase data stored in an area selected by the address ADDR. An erase voltage may be repetitively applied to the channel layers of the cell strings CS11 to CS1m and CS21 to CS2m of the selected memory block. Whether the threshold voltages of the memory cells of the selected memory block have reached an erase status E (see FIG. 7) may be repetitively verified. During the verification operation, a verification voltage may be applied to a word line of the selected memory block.

At a third point in time t3, if the threshold voltages of the memory cells of a selected page reach the threshold voltage corresponding to the data DATA, the program operation may be completed, and the ready busy signal RB may become disabled (e.g., logic high level). In other words, the ready busy signal RB represents the ready status.

In an embodiment, when the status signal STS is the status read response signal SRR (see FIG. 3), the semiconductor memory device 100 may provide the status read response signal SRR indicating the ready status in response to a status read signal SRS (see FIG. 3) received after the third point in time t3.

At a fourth point in time t4, in a state where the ready busy signal RB is output as the ready status, a dummy pulse Vdm may be applied to the unselected memory block. In an embodiment, the dummy pulse Vdm may be applied to the selected memory block. At a fifth point in time t5, the voltage level of the dummy pulse Vdm may decrease (e.g., transition to a low level).

The dummy pulse Vdm may have the width corresponding to a predetermined time period dV. The application of the dummy pulse Vdm may allow unintended charges injected to the channel layers of the cell strings CS11 to CS1m and CS21 to CS2m of the selected memory block and the unselected memory block to be discharged to the bit lines BL1 to BLm (see FIG. 5) and the common source line CSL (see FIG. 5). By the application of the dummy pulse Vdm to an unselected memory block in a state where the ready busy signal RB is output as the ready status, an operation time of a program or erase operation may not be increased by the application of the dummy pulse.

FIG. 10 is a table illustrating an example of a method for applying a dummy pulse Vdm.

Referring to FIGS. 5 and 10, the dummy pulse Vdm may be applied to the drain selection lines DSL1 and DSL2, source selection lines SSL1 and SSL2, word lines WL1 to WLn, and the pipe line PL. In addition, a reference voltage Vss may be applied to the bit lines BL1 to BLm and the common source line CSL. The reference voltage Vss may be a ground voltage.

Due to the positive dummy voltage Vdm applied to the drain selection lines DSL1 and DSL2, source selection lines SSL1 and SSL2, word lines WL1 to WLn, and the pipe line PL, the charges injected to the channel layers of the cell strings CS11 to CS1m and CS21 to CS2m may be discharged to the bit lines BL1 to BLm and the common source line CSL.

FIG. 11 is a table illustrating an example of a method for applying the dummy pulse Vdm.

Referring to FIGS. 5 and 11, the dummy pulse Vdm may be applied to the drain selection lines DSL1 and DSL2, and the source selection lines SSL1 and SSL2. The reference voltage Vss may be applied to the word lines WL1 to WLn, pipe line PL, bit lines BL1 to BLm, and the common source line CSL.

FIG. 12 is a table illustrating an example of a method for applying the dummy pulse Vdm.

Referring to FIGS. 5 and 12, the dummy pulse Vdm may be applied to the drain selection lines DSL1 and DSL2, and the source selection lines SSL1 and SSL2. The word lines WL1 to WLn, pipe line PL, bit lines BL1 to BLm, and the common source line CSL may float.

In addition to embodiments described with reference to FIGS. 10 to 12, it will be understood that embodiments in which the dummy pulse is applied to the selected memory blocks and the unselected memory blocks may be modified in a number of ways.

Figure 13:
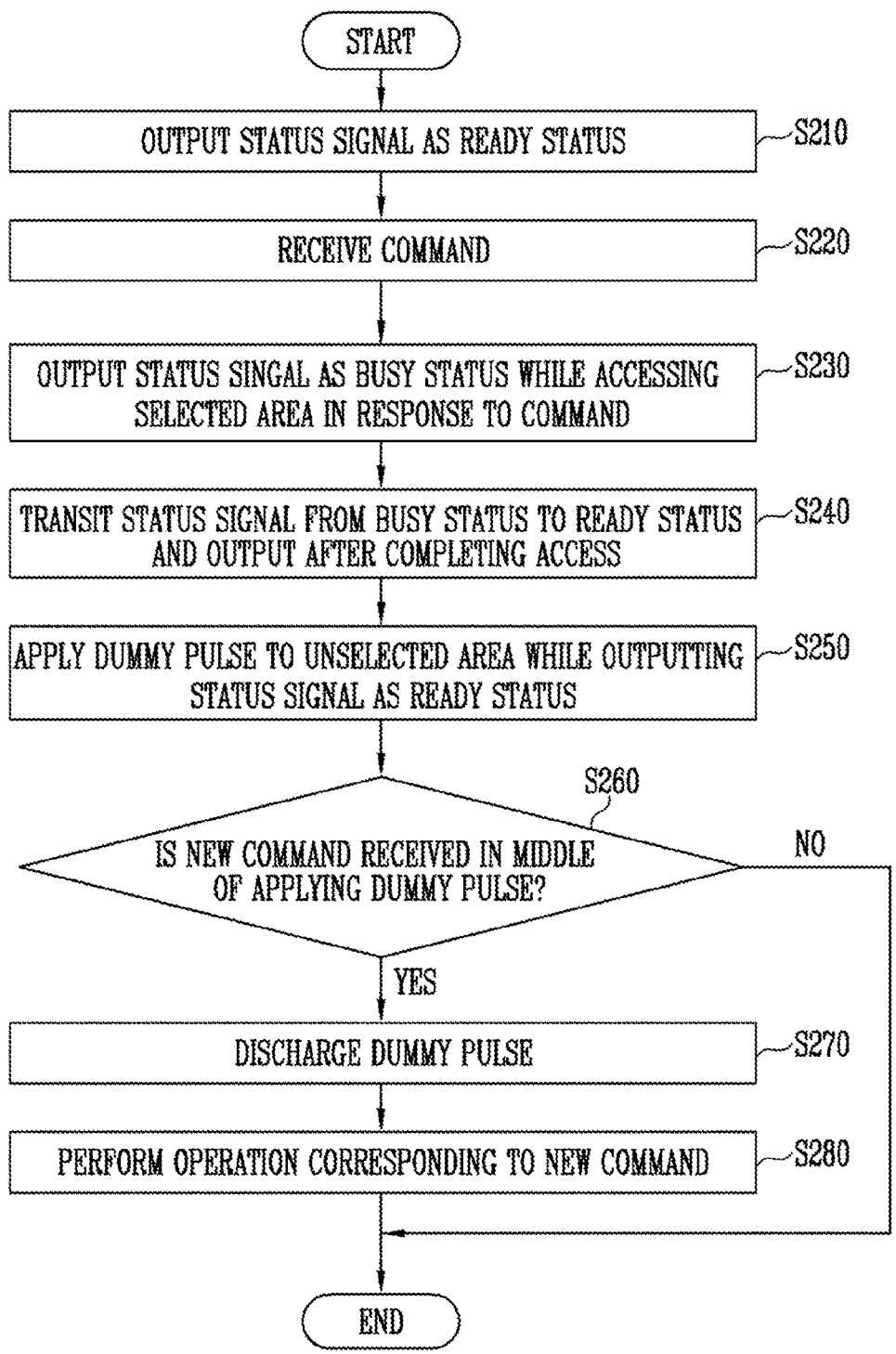
FIG. 13 is a flow chart illustrating an example of an operating method of a semiconductor memory device according to an embodiment of the present disclosure.

FIG. 13 is a flow chart illustrating an example of an operating method of a semiconductor memory device 100 according to an embodiment of the present disclosure. The operating method may include a plurality of steps S210, S220, . . . , and S280.

Referring to FIGS. 1, 4, and 13, the steps S210 to S250 may be similar to the steps S110 to S150 of FIG. 8. In the step S210, the status signal STS may be output as a ready status. In the step S220, a command may be received. In the step S230, if an area selected is accessed in response to the command, the status signal STS may be output as a busy status. In the step S240, after the access is completed, the status signal STS may change from the busy status to a ready status and the status signal STS having the ready status may be output. In the step S250, the status signal STS is output as the ready status, and the dummy pulse may be applied to an unselected area.

In the step S260, the step S270 may be performed depending on whether a new command is received in the middle of the application of the dummy pulse.

In the step S270, when a new command is received in the middle of the application of the dummy pulse, the voltage level of the dummy pulse may decrease (e.g., transition to a low level). In an embodiment, a time period, in which the new command and a corresponding address are received, may overlap the time when the voltage level of the dummy pulse decreases (e.g., transitions to the low level). When the new command corresponds to a program command, data may be further received. A time period in which the program command, a correspond address, and data are received may overlap the time when the voltage level of the dummy pulse decreases (e.g., transitions to the low level).

In the step S280, an operation corresponding to the new command may be performed, and the status signal STS may be output as the busy status.

Figure 14:
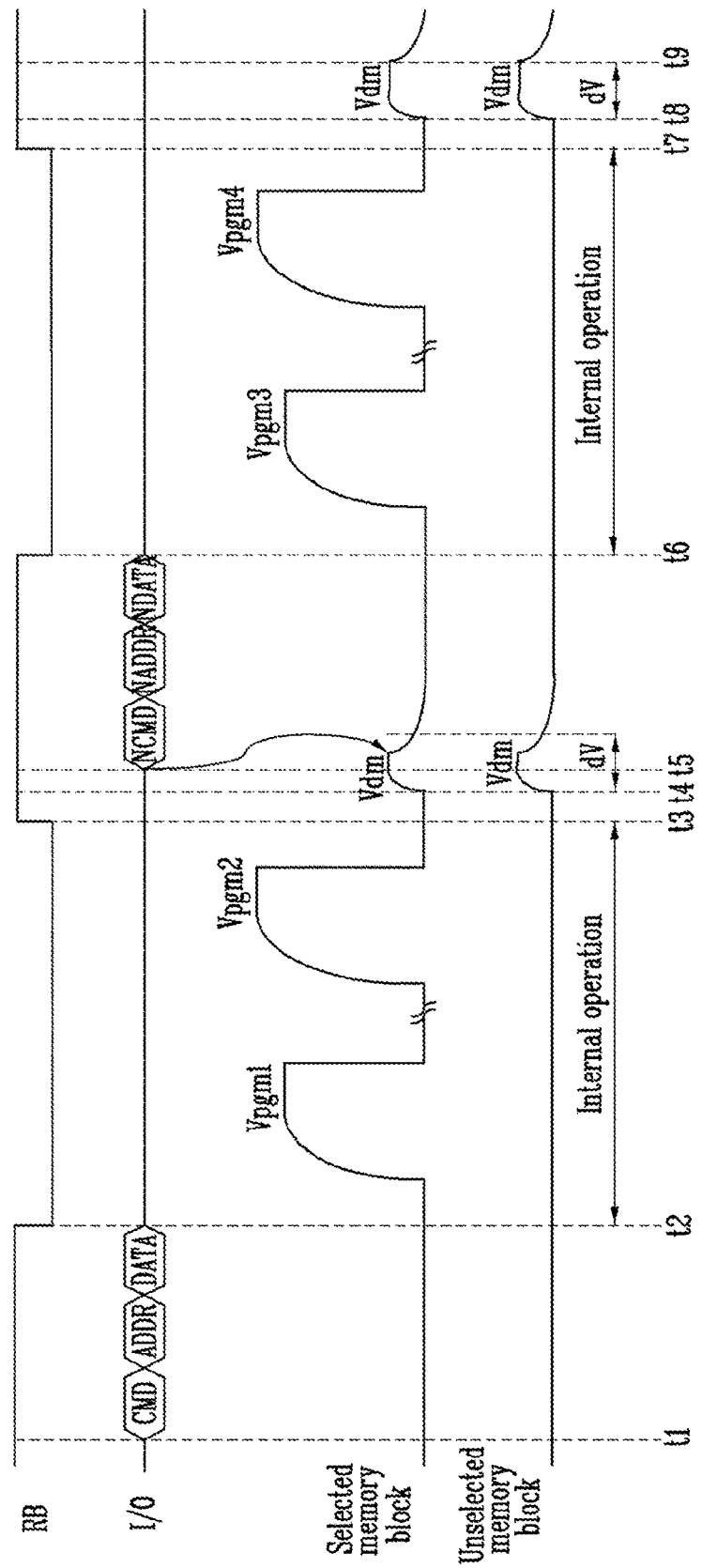
FIG. 14 is a timing diagram illustrating an example of an operating method of a semiconductor memory device according to an embodiment of the present disclosure.

FIG. 14 is a timing diagram illustrating an example of an operating method of a semiconductor memory device 100 according to an embodiment of the present disclosure. In the description with reference to FIG. 14, it is assumed that the status signal STS is a ready busy signal RB (see FIG. 2).

Referring to FIGS. 4 and 14, the ready busy signal RB, the input and output lines I/O, the selected memory blocks and the unselected memory blocks at the first point in time t1 to the fourth point in time t4 may be similar to those of FIG. 9. Hereinafter, the repetitive explanations will be omitted.

At a fifth point in time t5, in the middle of the application of the dummy pulse Vdm, a new command NCMD and a corresponding address NADDR may be received through the input and output lines I/O. Hereinafter, for convenience purposes, the new command CMD is assumed as a program command. When the command CMD is the program command, data DATA may be additionally received.

According to an embodiment of the present disclosure, the voltage level of the dummy pulse Vdm being applied may decrease (e.g., transition to a low level) in response to the new command NCMD and corresponding address NADDR. After a certain time period dV has passed from a time when the dummy pulse Vdm is applied, the voltage level of the dummy pulse Vdm may become the low level. The time when the dummy pulse Vdm decreases (e.g., transitions to the low level) may overlap the time when the new command NCNM and corresponding address NADDR are received. When the new command NCMD is a program command, since data NDATA is further received, a communication time between the semiconductor memory device 100 and the controller 200 may become longer. In this case, the time when the dummy pulse Vdm decreases (e.g., transitions to the low level) may more effectively overlap the time when the new command NCNM, the corresponding address NADDR, and the data NDATA are received.

At a sixth point in time t6, when the new command NCMD, the corresponding address NADDR, and the data NDATA are received, the ready busy signal RB may be enabled (e.g., logic low level), and the semiconductor memory device 100 may perform an internal operation.

The peripheral circuit 120 may program data DATA in an area selected by the address ADDR. A plurality of program voltages Vpgm3 and Vpgm4 may be applied to selected word lines of a selected memory block.

At a seventh point in time t7, when the threshold voltages of the memory cells of a selected page reach the threshold voltage corresponding to the data NDATA, the program operation is completed. The ready busy signal RB may be disabled (e.g., logic high level) to represent the ready status.

According to an embodiment, after the program or erase operation is completed, the dummy pulse Vdm may be applied. At an eighth point in time t8, since it is assumed that the new command NCMD is the program command, in a state where the ready busy signal RB is output as the ready status, a dummy pulse Vdm may be applied to the selected memory block and the unselected memory block.

At a ninth point in time t9, the voltage level of the dummy pulse Vdm may decrease (e.g., transition to a low level). The dummy pulse Vdm may have the width corresponding to a predetermined time period dV.

According to an embodiment of the present invention, even when the voltage level of the dummy pulse decreases (e.g., transitions to the low level) in response to the new command NCMD, the dummy pulse Vdm may be applied again after an operation corresponding to a next access (e.g., a program or erase operation) is performed. Accordingly, the charges injected to the channel layers of the cell strings (CS11 to CS1m and CS21 to CS2m (see FIG. 5) may be discharged.

Figure 15:
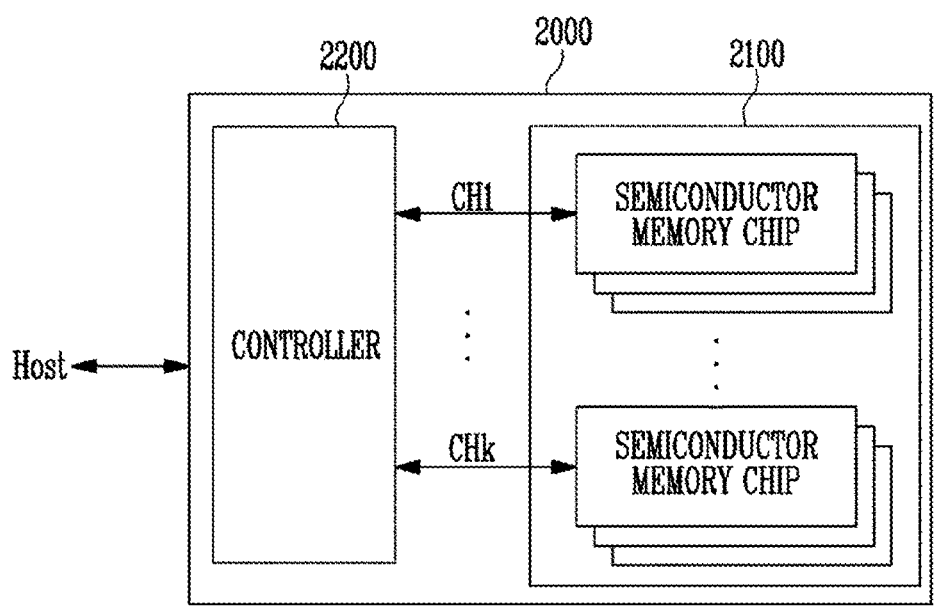
FIG. 15 is a diagram illustrating an application example of the memory system of FIG. 13.

FIG. 15 is diagram illustrating an application example 2000 of the memory system 1000 of FIG. 13.

Referring FIG. 15, the memory system 2000 may include the semiconductor memory device 2100 and a controller 2200. The semiconductor memory device 2100 may include a plurality of memory chips. The plurality of semiconductor memory chips may be divided into a plurality of groups.

In FIG. 15, it is illustrated that each of the plurality of groups communicates with the controller 2200 through first to $k^{th}$ channels CH1 to CHk. Each semiconductor memory chip may similarly operate to one of the semiconductor memory device 100 described with reference to FIG. 4.

Each group communicates with the controller 2200 through one common channel. The controller 2200 may be configured similarly to the controller 200 described with reference to FIG. 1, and may control a plurality of memory chips of the semiconductor memory device 2100 through the plurality of channels CH1 to CHk.

In FIG. 15, the plurality of memory chips are described to be connected to one channel. However, it will be understood that the memory system 2000 may be modified so that one semiconductor chip is connected to one channel.

The controller 2200 and the semiconductor memory device 2100 may be integrated into one semiconductor device. In an embodiment, the controller 2200 and the semiconductor memory device 2100 may be integrated into one semiconductor device to form a memory card. For example, the controller 2200 and the semiconductor memory device 2100 may be integrated into one semiconductor device to form a memory card including a personal computer memory card international association (PCMCIA), compact flash card (CF), smart media card (SMC), memory stick multimedia card (MMC, RS-MMC, or MMCmicro), SD card (SD, miniSD, microSD, or SDHC), universal flash storage (UFS) or the like.

The controller 2200 and the semiconductor memory device 2100 may be integrated into one semiconductor device to form a solid state drive (SSD). The SSD may include a storage device that stores data in a semiconductor memory. When the memory system 2000 is used as the SSD, an operation speed of the host connected to the memory system 2000 may be improved.

In an example, the memory system 2000 may be provided as one of various elements of an electronic device including a computer, Ultra Mobile PC (UMPC), workstation, net-book, Personal Digital Assistants (PDA), portable computer, web tablet, wireless phone, mobile phone, smart phone, e-book, portable multimedia player (PMP), game console, navigation device, black box, digital camera, 3-dimensional television, digital audio recorder, digital audio player, digital picture recorder, digital picture player, digital video recorder, digital video player, a device capable of transmitting/receiving information in an wireless environment, one of various devices for forming a home network, one of various electronic devices for forming a computer network, one various electronic devices for forming a telematics network, RFID device, one of various elements for forming a computing system, or the like.

In an embodiment, the semiconductor memory device 2100 or the memory system 2000 may be embedded as various types of packages. For example, the semiconductor memory device 2100 or the memory system 2000 may be packaged to be embedded in a type including Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 16:
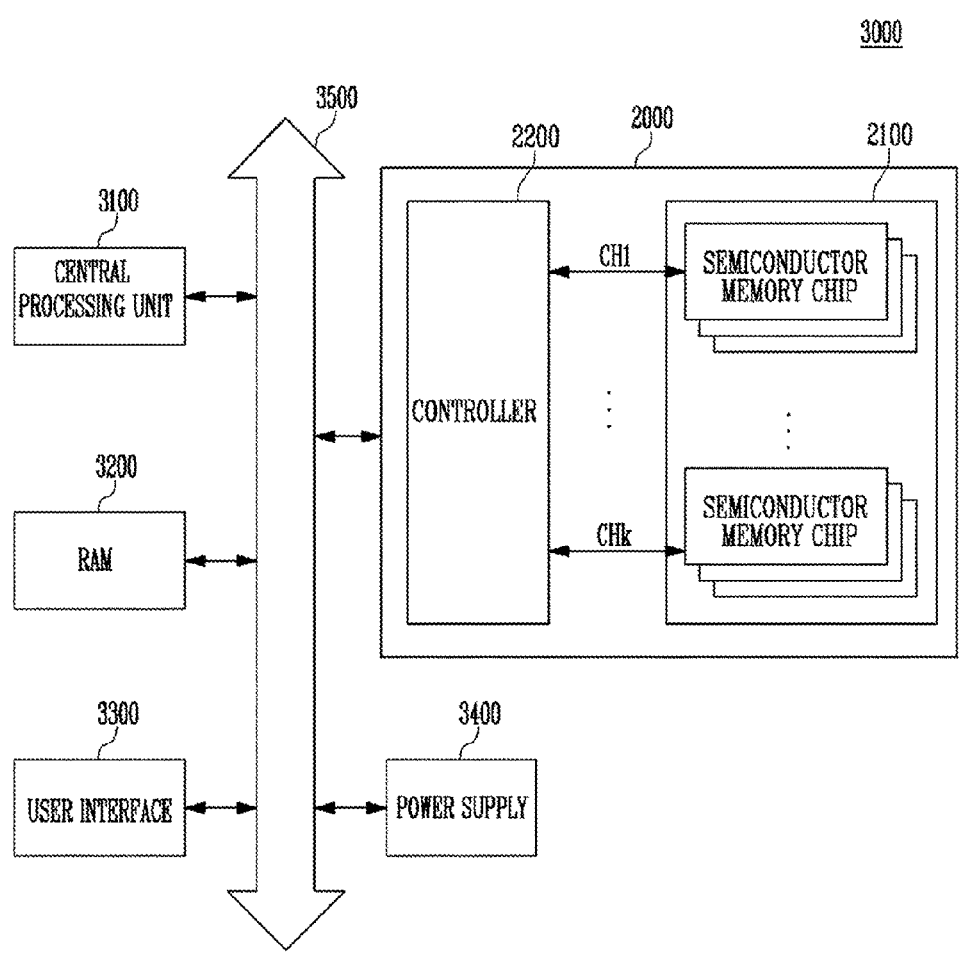
FIG. 16 is a diagram illustrating an example of a computing system including the memory system explained in relation to FIG. 15.

FIG. 16 is a diagram illustrating an example of a computing system including the memory system 2000 explained in relation to FIG. 15.

Referring to FIG. 16, the computing system 3000 may include a central processing unit 3100, RAM 3200, a user interface 3300, a power supply 3400, a system bus 3500, and a memory system 2000.

The memory system 2000 may be electrically connected to the CPU 3100, RAM 3200, user interface 3300, and the power supply 3400 through the system bus 3500. Data provided through the user interface 3300 or processed by the CPU 3100 may be stored in the memory system 2000.

In FIG. 16, the semiconductor memory device 2100 is illustrated to be connected to the system bus 3500 through the controller 2200. However, the semiconductor memory device 2100 may be directly connected to the system bus 3500, and a function of the controller 2200 may be performed by the CPU 3100 and the RAM 3200.

In FIG. 16, the memory system 2000 described in relation to FIG. 15 is provided. However, the memory system 2000 may be replaced with the memory system 1000 described in relation to FIG. 1. In an embodiment, the computing system 3000 may include all the memory systems 1000 and 2000 described in relation to FIGS. 1 and 15.

According to embodiment of the present disclosure, after a program or erase operation, a dummy pulse may be applied with a status signal output as a ready status. Accordingly, reliability of data stored in memory cells may be improved without an increase in an operation time of the program or erase operation, which could have been caused by the application of the dummy pulse.

According to various embodiments of the present disclosure, a semiconductor memory device having improved reliability and an improved operating speed, and an operating method thereof are provided.

While the present disclosure has been described with reference to exemplary embodiments thereof, various modifications may be made to the described embodiments without departing from the spirit and scope of the invention. Therefore, the scope of the present disclosure is not limited to the described embodiments but is defined by the claims and their equivalents.

What is claimed is:

1. An operating method of a semiconductor memory device, which comprises a memory cell array, the operating method comprising:
   receiving a command;
   outputting a status signal as a busy status while accessing a selected area of the memory cell array in response to the command;
   changing the status signal from the busy status to a ready status and outputting the status signal after the access is completed; and
   applying a dummy pulse to an unselected area of the memory cell array in response to the status signal being output as the ready status.

2. The operating method according to claim 1, wherein applying the dummy pulse comprises applying the dummy pulse to the selected area in response to the status signal being output as the ready status.

3. The operating method according to claim 1, further comprising decreasing a voltage level of the dummy pulse if a second command is received when the dummy pulse is being applied.

4. The operating method according to claim 3, wherein a time when the dummy pulse decreases overlaps a time when the second command and an address corresponding to the second command are received.

5. The operating method according to claim 3, further comprising performing an operation corresponding to the second command after the dummy pulse has changed to a low level,
   wherein the status signal is output as a busy status while the operation corresponding to the second command is performed.

6. The operating method according to claim 1, wherein the memory cell array comprises a plurality of memory blocks corresponding to a unit of an erase operation, and wherein:
   each of the plurality of memory blocks comprises drain selection transistors, source selection transistors, and memory cells coupled between the drain selection transistors and the source selection transistors;
   the selected area is a first memory block among the plurality of memory blocks; and
   the unselected area is remaining second memory blocks among the plurality of memory blocks.

7. The operating method according to claim 6, wherein applying the dummy pulse comprises applying the dummy pulse to the drain selection transistors, the memory cells, and the source selection transistors of the second memory blocks in response to the status signal being output as the ready status.

8. The operating method according to claim 6, wherein applying the dummy pulse comprises applying the dummy pulse to the drain selection transistors and the source selection transistors of the second memory blocks in response to the status signal being output as the ready status.

9. The operating method according to claim 6, wherein:
   the memory cells are divided into first memory cells and second memory cells;
   each of the plurality of memory blocks further comprises pipe selection transistors coupled between the first memory cells and the second memory cells; and
   applying the dummy pulse comprises applying the dummy pulse to the drain selection transistors, the memory cells, pipe selection transistors, and the source selection transistors of the second memory blocks in response to the status signal being output as the ready status.

10. The operating method according to claim 6, wherein applying the dummy pulse comprises applying the dummy pulse to the drain selection transistors, the memory cells, and the source selection transistors of the plurality of memory blocks in response to the status signal being output as the ready status.

11. The operating method according to claim 6, wherein applying the dummy pulse comprises applying the dummy pulse to the drain selection transistors and the source selection transistors of the plurality of memory blocks in response to the status signal being output as the ready status.

12. The operating method according to claim 6, wherein:
   the memory cells are divided into first memory cells and second memory cells;
   each of the plurality of memory blocks further comprises pipe selection transistors coupled between the first memory cells and the second memory cells; and
   applying the dummy pulse comprises applying the dummy pulse to the drain selection transistors, the memory cells, the pipe selection transistors, and the source selection transistors of the plurality of memory blocks in response to the status signal being output as the ready status.

13. The operating method according to claim 1, wherein the status signal is a ready busy signal.

14. The operating method according to claim 1, wherein the status signal is a status read response signal.

15. The operating method according to claim 1, wherein the access corresponds to a program operation.

16. The operating method according to claim 1, wherein the access corresponds to an erase operation.

17. A semiconductor memory device comprising:
   a memory cell array comprising a plurality of memory blocks; and a peripheral circuit configured to perform a plurality of steps, the steps including:
  accessing memory blocks selected from among the plurality of memory blocks of the memory cell array while outputting a status signal as a busy status in response to a command;
  outputting the status signal as the ready status after the access has been completed; and
  applying a dummy pulse to unselected memory blocks in response to the status signal being output as the ready status.

18. The semiconductor memory device according to claim 17, wherein the steps further including applying the dummy pulse to the selected memory block.

19. The semiconductor memory device according to claim 17, wherein the steps further including decreasing a voltage level of the dummy pulse a second command is received when the dummy pulse is being applied.

20. The semiconductor memory device according to claim 19, wherein a time when the dummy pulse decreases overlaps a time when the second command and an address corresponding to the second command are received.

* * * * *